United States Patent
Lii et al.

(10) Patent No.: US 8,524,595 B2
(45) Date of Patent: Sep. 3, 2013

(54) SEMICONDUCTOR PACKAGE STRUCTURES

(75) Inventors: Mirng-Ji Lii, Sinpu Township (TW); Hsin-Hui Lee, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 479 days.

(21) Appl. No.: 12/614,727

(22) Filed: Nov. 9, 2009

(65) Prior Publication Data

US 2010/0055846 A1 Mar. 4, 2010

Related U.S. Application Data

(63) Continuation of application No. 11/761,722, filed on Jun. 12, 2007, now abandoned.

(51) Int. Cl.
*H01L 21/60* (2006.01)

(52) U.S. Cl.
USPC ........... 438/613; 257/737; 257/738; 257/772; 257/780; 257/787; 257/E21.503; 257/E21.508; 257/E23.021; 257/E23.023; 361/783

(58) Field of Classification Search
USPC ................. 438/612, 613; 257/737, 738, 772, 257/780, 787, E21.508, E23.021, E23.023, 257/E21.503; 361/783
See application file for complete search history.

(56) References Cited

U.S. PATENT DOCUMENTS

| | | | |
|---|---|---|---|
| 5,060,844 A * | 10/1991 | Behun et al. ............. | 228/180.21 |
| 5,704,116 A * | 1/1998 | Gamota et al. .................. | 29/840 |
| 5,796,169 A * | 8/1998 | Dockerty et al. ............. | 257/780 |
| 5,869,904 A * | 2/1999 | Shoji ............................. | 257/779 |
| 5,985,456 A * | 11/1999 | Zhou et al. ..................... | 428/414 |
| 6,017,634 A * | 1/2000 | Capote et al. ................. | 428/414 |
| 6,121,689 A * | 9/2000 | Capote et al. ................. | 257/783 |
| 6,168,972 B1 * | 1/2001 | Wang et al. .................... | 438/108 |
| 6,265,776 B1 * | 7/2001 | Gilleo ........................... | 257/738 |
| 6,297,560 B1 | 10/2001 | Capote et al. | |
| 6,335,571 B1 * | 1/2002 | Capote et al. ................. | 257/787 |
| 6,352,881 B1 * | 3/2002 | Nguyen et al. ................ | 438/108 |
| 6,483,191 B2 * | 11/2002 | Umezaki ........................ | 257/738 |
| 6,559,390 B1 * | 5/2003 | Tanaka .......................... | 174/260 |
| 6,578,755 B1 * | 6/2003 | Elenius et al. ................ | 228/254 |
| 6,605,525 B2 | 8/2003 | Lu et al. | |
| 6,756,253 B1 * | 6/2004 | Farnworth et al. ............ | 438/125 |
| 6,808,959 B2 * | 10/2004 | Umezaki ........................ | 438/106 |
| 6,819,004 B2 * | 11/2004 | Kirsten .......................... | 257/788 |
| 6,854,633 B1 * | 2/2005 | Grigg et al. ..................... | 228/33 |
| 6,897,142 B2 * | 5/2005 | Fujimori et al. ............. | 438/615 |
| 6,940,177 B2 | 9/2005 | Dent et al. | |
| 7,078,820 B2 * | 7/2006 | Yanagida ...................... | 257/779 |
| 7,091,062 B2 | 8/2006 | Geyer | |
| 7,109,061 B2 * | 9/2006 | Crane et al. .................... | 438/118 |
| 7,118,833 B2 * | 10/2006 | Elenius et al. .................... | 430/5 |
| 7,122,459 B2 * | 10/2006 | Feng ............................. | 438/613 |
| 7,126,164 B2 * | 10/2006 | Johnson et al. ................. | 257/99 |

(Continued)

*Primary Examiner* — Mary Wilczewski
(74) *Attorney, Agent, or Firm* — Duane Morris LLP (57) ABSTRACT

A semiconductor structure includes a plurality of solder structures between a first substrate and a second substrate. A first encapsulation material is substantially around a first one of the solder structures and a second encapsulation material is substantially around a second one of the solder structures. The first one and the second one of the solder structures are near to each other and a gap is between the first encapsulation material and the second encapsulation material.

20 Claims, 10 Drawing Sheets

(56) References Cited

U.S. PATENT DOCUMENTS

| | | | |
|---|---|---|---|
| 7,150,390 B2* | 12/2006 | Johnson et al. | 228/214 |
| 7,250,362 B2* | 7/2007 | Huang | 438/612 |
| 7,331,502 B2* | 2/2008 | Okada et al. | 228/180.22 |
| 7,417,305 B2* | 8/2008 | Jiang et al. | 257/632 |
| 7,612,450 B2* | 11/2009 | Lee et al. | 257/738 |
| 7,981,725 B2* | 7/2011 | Shen et al. | 438/108 |
| 2001/0042923 A1* | 11/2001 | Yanagida | 257/779 |
| 2001/0048160 A1* | 12/2001 | Umezaki | 257/738 |
| 2002/0046860 A1* | 4/2002 | Xu et al. | 174/52.2 |
| 2003/0201309 A1* | 10/2003 | Grigg et al. | 228/207 |
| 2004/0046252 A1* | 3/2004 | Fujimori et al. | 257/734 |
| 2004/0266162 A1* | 12/2004 | Feng | 438/613 |
| 2005/0082670 A1* | 4/2005 | Quinones et al. | 257/737 |
| 2006/0038291 A1* | 2/2006 | Chung et al. | 257/738 |
| 2006/0113632 A1 | 6/2006 | Kimura et al. | |
| 2006/0244139 A1* | 11/2006 | Daubenspeck et al. | 257/737 |
| 2006/0286791 A1* | 12/2006 | Feng | 438/613 |
| 2007/0090160 A1* | 4/2007 | Masumoto | 228/101 |
| 2008/0006949 A1* | 1/2008 | Lee et al. | 257/780 |
| 2008/0308932 A1 | 12/2008 | Lii et al. | |
| 2009/0166897 A1* | 7/2009 | Katsurayama et al. | 257/793 |
| 2010/0055846 A1* | 3/2010 | Lii et al. | 438/124 |
| 2010/0090334 A1* | 4/2010 | Masumoto | 257/693 |
| 2010/0159645 A1* | 6/2010 | Yanagida | 438/113 |
| 2011/0095423 A1* | 4/2011 | Ohashi et al. | 257/737 |
| 2011/0157853 A1* | 6/2011 | Goh | 361/783 |

* cited by examiner

SEMICONDUCTOR PACKAGE STRUCTURES

This application is a continuation of U.S. patent application Ser. No. 11/761,722, filed Jun. 12, 2007, the entirety of which is incorporated by reference herein.

BACKGROUND OF THE INVENTION

1. Field of the Invention

The present invention relates to semiconductor structures, and more particularly to semiconductor package structures and method for forming the package structures

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed and are being used along with techniques for overcoming manufacturing obstacles associated with these materials and requirements. Further, package techniques incorporating with small-dimension integrated circuits would provide desired chip packages.

Figure 1:
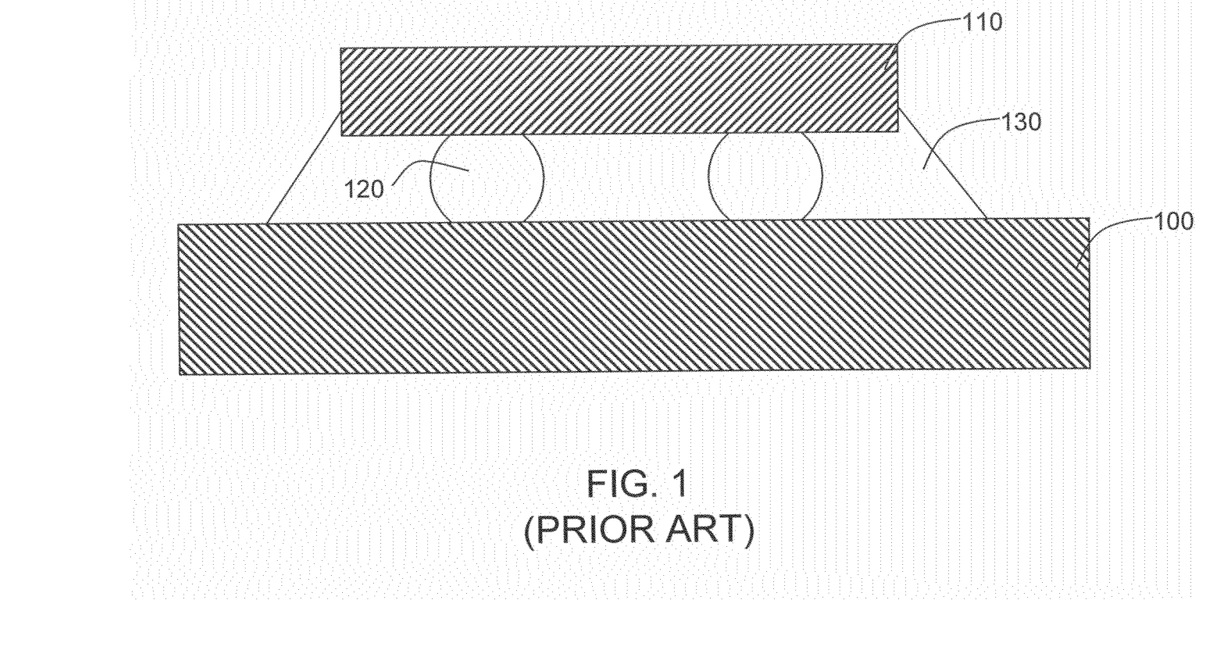
FIG. 1 is a cross-sectional view of a traditional package structure.

FIG. 1 is a cross-sectional view of a traditional package structure. The package structure 101 includes solder balls 120 bonded on substrate 110. The substrate 110 with the solder balls 120 is then flipped and mounted on substrate 100. After the mounting step, an under-filler material 130 is filled between the substrates 100 and 110, protecting the solder balls 120 from particle contamination and electrically isolating the adjacent solder balls 120. The underfill also provides mechanical support and helps prevent failure of the solder joints.

SUMMARY OF THE INVENTION

In accordance with some exemplary embodiments, a semiconductor structure includes a plurality of solder structures between a first substrate and a second substrate. A first encapsulation material is substantially around a first one of the solder structures and a second encapsulation material is substantially around a second one of the solder structures. The first one and the second one of the solder structures are near to each other and a gap is between the first encapsulation material and the second encapsulation material.

The above and other features will be better understood from the following detailed description of the exemplary embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DETAILED DESCRIPTION OF EXEMPLARY EMBODIMENTS

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

FIGS. 2A-2E are schematic drawings showing an exemplary method for forming a package structure.

Figure 2A:
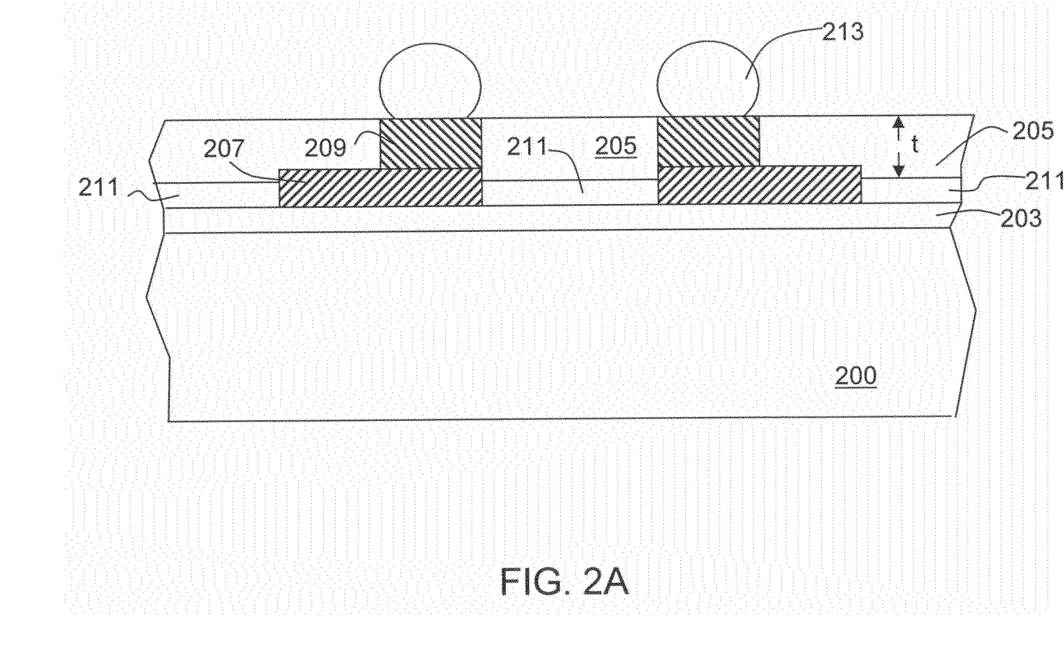
FIGS. 2A-2E are schematic drawings showing an exemplary method for forming a package structure.

Referring to FIG. 2A, at least one dielectric layer such as dielectric layer 203 is formed over a substrate 200 such as semiconductor wafer with diameter 8 inch, 12 inch or greater than 12 inch. At least one metal trace layer such as metal trace layers 207 are formed over the dielectric layer 203. At least one pad such as pads 209 are formed over the metal trace layers 207. At least one isolation layer such as isolation layer 211 is formed over the dielectric layer 203. At least one passivation layer such as passivation layer 205 is formed over the metal trace layers 207. In some embodiments, the passivation layer 205 may have a surface substantially level with at least one of the surfaces of the pads 209. At least one solder structure such as solder structures 213 are formed over the pads.

The substrate 200 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, at least one diode, transistor, device, circuit or other semiconductor structure or various combinations thereof (not shown) are formed below the dielectric layer 203 and electrically coupled to each other.

In some embodiments, the dielectric layer 203 may be a dielectric layer of an interconnect structure. The dielectric layer 203 may be referred to as an inter-metal dielectric (IMD) layer. The material of the dielectric layer 203 may comprise oxide, nitride, oxynitride, low-k dielectric material, ultra low-k dielectric material or other dielectric material or various combinations thereof. The dielectric layer 203 may be formed by, for example, a chemical vapor deposition (CVD) step, a spin-on glass (SOG) step, or other method that is adequate to form a dielectric layer or various combinations thereof. In some embodiments, at least one metallic layer (not shown) is formed within and/or under the dielectric layer 203. The metallic layer may be provided for electrical connection between the metal trace layer 207 and at least one diode, transistor, device, circuit or other semiconductor structure or various combinations thereof (not shown) formed below the dielectric layer 203 and electrically coupled thereto.

The metal trace layers 207 may be provided for electrical connection between the pads 209 and the metallic layer (not shown) formed within and/or under the dielectric layer 203. The material of the metal trace layers 207 may comprise at least one of copper (Cu), aluminum (Al), aluminum copper (AlCu), aluminum silicon copper (AlSiCu), or other conductive material or various combinations thereof. The metal trace layers 207 may be formed by, for example, a chemical vapor deposition (CVD) step, a physical vapor deposition (PVD)

step, an electroplating step, an electroless-plating step or other step that is adequate to for a thin film layer or various combinations thereof.

The pads 209 are provided for electrical connection with the metal trace layers 207 and the solder structures 213. The material of the pads 209 may comprise at least one material such as copper (Cu), aluminum (Al), aluminum copper (AlCu), aluminum silicon copper (AlSiCu), or other conductive material or various combinations thereof. The pads 209 may be formed by, for example, a chemical vapor deposition (CVD) step, a physical vapor deposition (PVD) step, an electroplating step, an electroless-plating step or other step that is adequate to for a thin film layer or various combinations thereof. In some embodiments, at least one of the pads 209 may include an under bump metallization (UBM) layer formed under the solder structure 213.

The isolation layer 211 may be provided to desirably isolate two adjacent metal trace layers 207. In some embodiments, the isolation layer 211 may be a stress buffer for releasing stresses of the package structure. The material of the isolation layer 211 may comprise, for example, polymide, oxide, nitride, oxynitride, or other material that is adequate to provide desired electrical isolation and/or stress release or various combinations thereof.

The passivation layer 205 is provided to protect the pads 209, the metal trace layers 207, the dielectric layer 203 and/or any diode, transistor, device, circuit or other semiconductor structure or various combinations thereof (not shown) formed below the dielectric layer 203. The material of the passivation layer 205 may comprise at least one of oxide, nitride, oxynitride, polyimide, or other material that is adequate to provide desired protection or various combinations thereof. The passivation layer 205 may be formed by, for example, a chemical vapor deposition (CVD) step, a spin-on glass (SOG) step, or other method that is adequate to form a film layer or various combinations thereof. In some embodiments, the passivation layer 205 may have a thickness "t" between about 0.5 μm and about 100 μm. Other dimension of the thickness "t" of the passivation layer 205 may be used in other embodiments. The scope of the invention is not limited thereto.

The solder structures 213 are formed over the pads 209. The solder structures 213 may comprise, for example, solder balls and/or solder bumps. In some embodiments, the solder structures 213 may comprise at least one material such as eutectic tin-lead (Sn—Pb) solder, high lead solder, lead free solder, metal pillar such as copper pillar or other solder material or various combinations thereof. In some embodiments, the solder structures 213 may have a height between about 0.1 millimeter (mm) and about 0.6 mm. Other dimension of the height of the solder structures 213 may be used in other embodiments. The scope of the invention is not limited thereto.

Figure 2B:
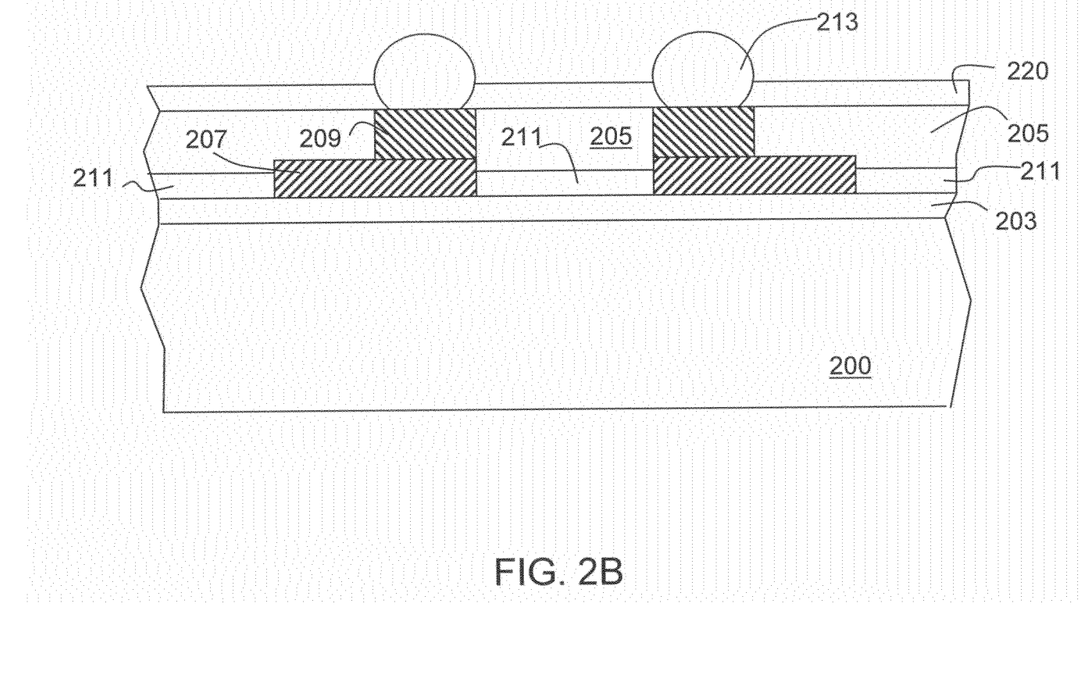

Referring to FIG. 2B, an encapsulation material 220 is formed over the passivation layer 205, partially covering the solder structures 213. The encapsulation material 220 may comprise resin-containing epoxy or polymer-based material like a mixture of resin powder and flux. In some embodiments, the flux may include de-oxidation material. The encapsulation material 220 may be formed by, for example, a spin-coating step.

In some embodiments, the encapsulation material 220 may have a thickness between about ⅓ of the height of the solder structure 213 and about 9/10 of the height of the solder structures. In other embodiments, the encapsulation material 220 may have a thickness larger than about 10 um, preferred between about 10 μm and about 30 μm. In still other embodiments, the encapsulation material 220 may be formed to a desired height, such that the encapsulation material 220 can wrap around a major portion of the solder structures as shown in FIG. 2D or 2E.

Figure 2C:
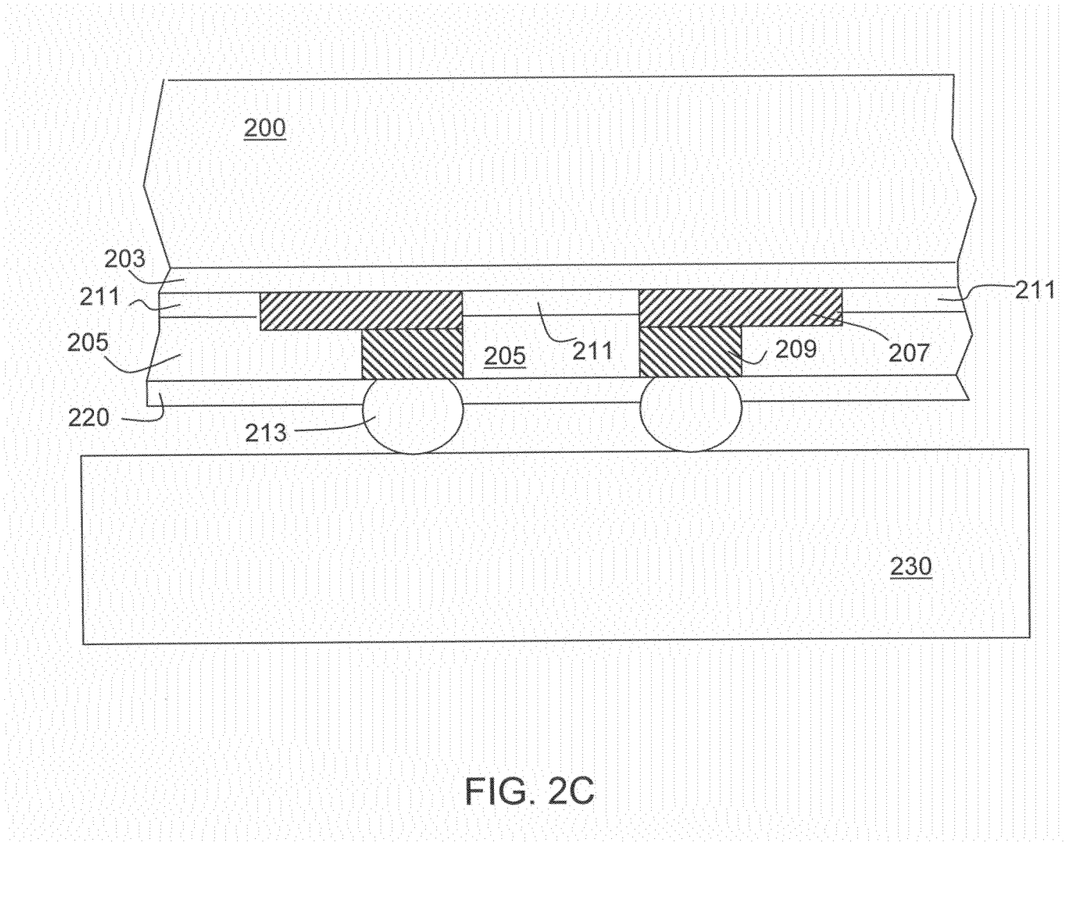
Figure 2D:
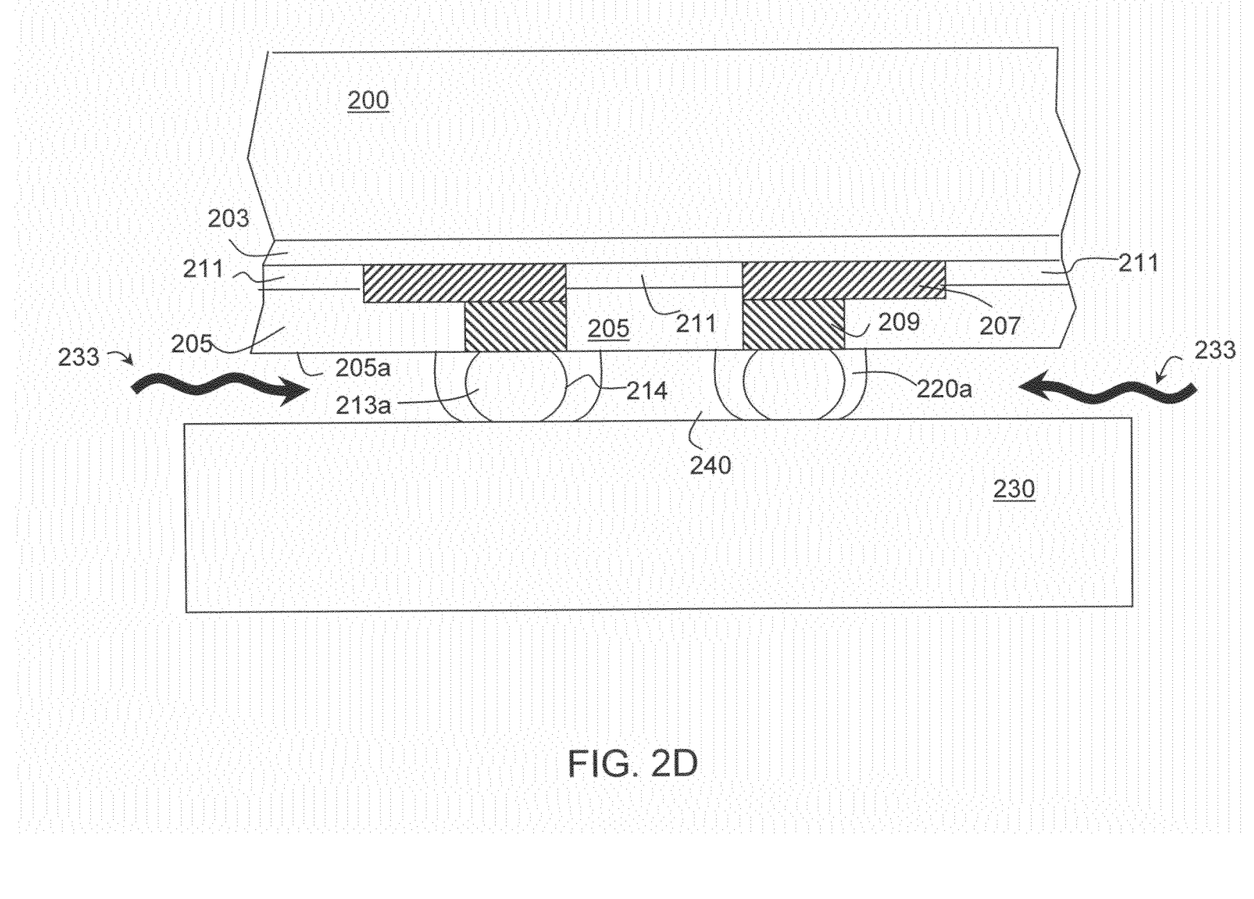
Figure 2E:
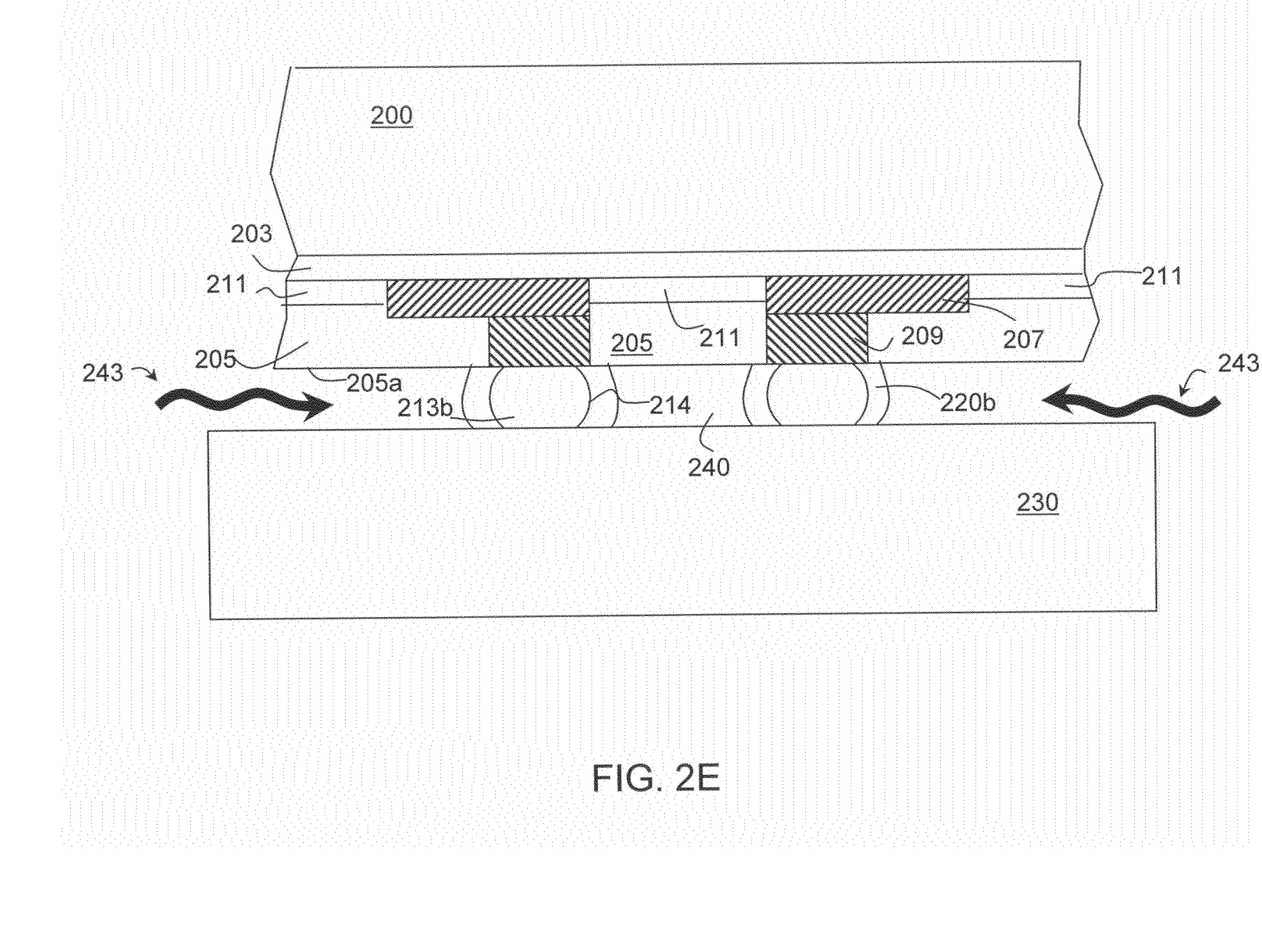

After forming the solder structures 213, the structure shown in FIG. 2B may be subjected to a sawing process so as to create a plurality of individual dies 200a as shown in FIG. 2C. The sawing process may include a laser sawing step, a water sawing step, a blade sawing step, other method that is adequate to cut the substrate 200 or various combinations thereof.

Referring to FIG. 2C, the structure shown in FIG. 2B may be flipped, such that the solder structures 213 contact a substrate 230. The substrate 230 may be a printed circuit board (PCB), a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example.

In some embodiments for providing desired mechanical support, coefficient of thermal expansion (CTE) of the encapsulation material 220 is between the CTE of substrate 300 and substrate 230.

In some embodiments, the substrate 230 may comprise at least one pad (not shown) for electrical connection with the solder structures 213. In other embodiments, at least one diode, transistor, device, circuit or other semiconductor structure or various combinations thereof (not shown) are formed below the pad (not shown) and electrically coupled to each other.

Referring to FIG. 2D, a thermal process 233 may be applied to the encapsulation material 220, such that the encapsulation material 220 melts and flows along at least one sidewall such as sidewalls 214 of the solder structures 213a. Accordingly, the encapsulation material layers 220a are formed on the sidewalls 214 of the solder structures 213a. In some embodiments, the thermal process 233 may be conducted in a furnace, a rapid thermal processing (RTP) apparatus, oven or other thermal processing apparatus or combinations thereof.

Figure 3:
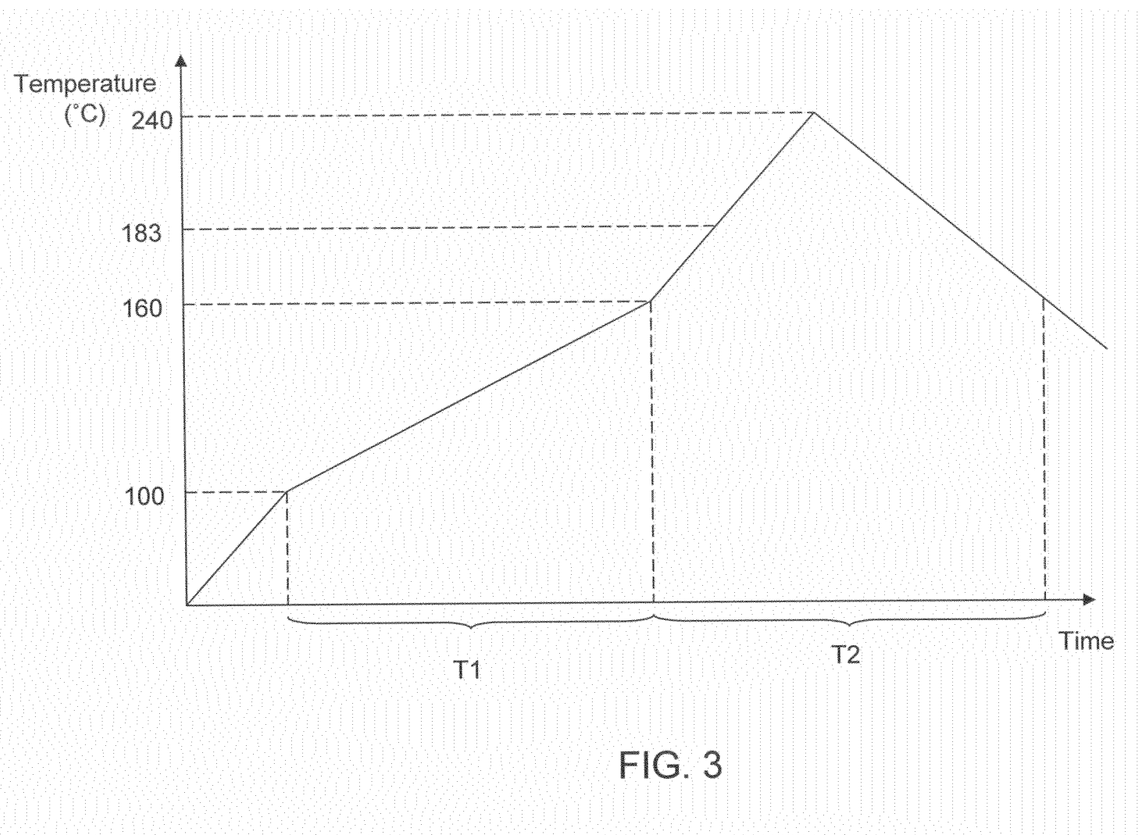
FIG. 3 is a schematic graph showing at least one thermal process for treating exemplary package structures.

In some embodiments, the thermal process 233 may heat the encapsulation material 220 between about 100° C. and about 160° C. for a processing time "T1" as shown in FIG. 3. In some embodiments, the thermal process 233 may also soften and/or melt the solder structures 213, such that the height of the solder structures 213a may be slightly less than that of the solder structures 213 (shown in FIG. 2C).

Referring again to FIG. 2D, as the encapsulation material layers 220a flows along the sidewalls 214 of the solder structures 213a, a gap 240 may be formed between the adjacent encapsulation material layers 220a. In some embodiments, a part (not shown) of the encapsulation material 220 may remain on the surface 205a of the passivation layer 205.

Referring to FIG. 2E, another thermal process such as a reflow process 243 may be applied to the encapsulation material 220a and/or the solder structures 213a, such that the reflowed solder structures 213b may desirably contact the substrate 230. In some embodiments, the reflow process 243 may be conducted within a furnace, a rapid thermal processing (RTP) apparatus, oven or other thermal processing apparatus or combinations thereof.

In some embodiments, the reflow process 243 may desirably soften the solder structures 213b such that the stacked structure shown in FIG. 2E may be reduced to a desired package height. The reflow process 243 may soften and/or melt the solder structures 213a, such that the height of the solder structures 213b may be slightly less than that of the solder structures 213a (shown in FIG. 2D).

In some embodiments, the reflow process 243 may heat the solder structures 213a (shown in FIG. 2D) between about 160° C. and about 240° C. for a processing time "T2" as shown in FIG. 3. Other process temperatures and/or processing time of the reflow process 243 may be used in other exemplary embodiments. The scope of the present invention is not limited thereto.

In other embodiments, the reflow process 243 may heat the encapsulation material layers 220a (shown in FIG. 2D), such that the encapsulation material layers 220a may flow along the sidewalls 214 of the solder structures 213a so as to form the encapsulation material layers 220b and the solder structures 213b. Accordingly, the gap 240 may be formed between the adjacent encapsulation material layers 220b. In some embodiments, a part (not shown) of the encapsulation material 220 (shown in FIG. 2A) may remain on the surface 205a of the passivation layer 205. The encapsulation material layers 220b may be substantially conformal on the sidewalls 214 of the solder structures 213b.

In some embodiments, the reflow process 243 described in conjunction with FIG. 2E may be used to form the desired encapsulation material layers 220b and the solder structures 213b as shown in FIG. 2E. In the embodiments, the thermal process 233 described in conjunction with FIG. 2D may be omitted. In some embodiments, the reflow process 243 may have a process temperature between about 100° C. and about 240° C. Other process temperatures and/or processing time of the reflow process 243 may be used in other exemplary embodiments. The scope of the present invention is not limited thereto.

Referring again to FIG. 1, the under-filler 130 is filled between the substrates 100 and 110 after the substrate 100 with the solder bumps 120 is bonded on the substrate 100. Unlike the under-filler 130, the encapsulation material 220 (shown in FIG. 2B) may be formed before the bonding process and thus may be formed in a semiconductor manufacturing facility, rather than in a package/testing factory. By reflowing the encapsulation material 220 so as to form the encapsulation material layers 220b, the process for forming the under-filler 130 described in conjunction with FIG. 1 can be omitted. Accordingly, tools and modules for forming the under-filler 130 can be omitted.

It is found that the under-filler 130 tends to trap moisture generated from the filling process itself and/or absorb moisture from environment. It is found that moisture may contribute to IMD delamination occurring at the die edge of the substrate 110 if the under-filler 130 is not well developed. As the processes described in conjunction with FIGS. 2A-2E do not apply the under-filler 130 between the substrate 230 and passivation layer 205, no development of an under-filler material is used. Accordingly, the processes described in conjunction with FIGS. 2A-2E are not subject to the concern of the traditional structure shown in FIG. 1.

Further, at least one gap such as gap 240 is formed between the adjacent solder structures 213b. With the thermal process 233 and/or the reflow process 243, moisture within the encapsulation material layers 220b may be desirably expelled from the region between the die 200a and the substrate 230. In some embodiments, the gap 240 may be circumferential around at least one of the encapsulation material layers 220b between the die 200a and the substrate 230.

Referring again to FIG. 1, after forming the bumps 120 on a wafer which is sawed to provide a plurality of dies 110. The die 110 is then flipped and bonded on the substrate 100. Then the underfill 130 is filled between the die 110 and the substrate 100. Unlike the traditional process, the encapsulation material layer 220 is formed at the wafer level of the substrate 200 as shown in FIG. 2B. The substrate 200 is then subject to a dicing process resulting to a plurality of dies 200a with the encapsulation material layer 220 formed thereover. The die 200a is then flipped and then subject to at least one of the thermal process 233 and the reflow process 243 as shown in FIGS. 2D and 2E, respectively, so as to flow the encapsulation material layer 220 substantially around the solder structures 213b. Therefore, the underfilling process used in the traditional process can be optionally omitted.

Figure 2F:
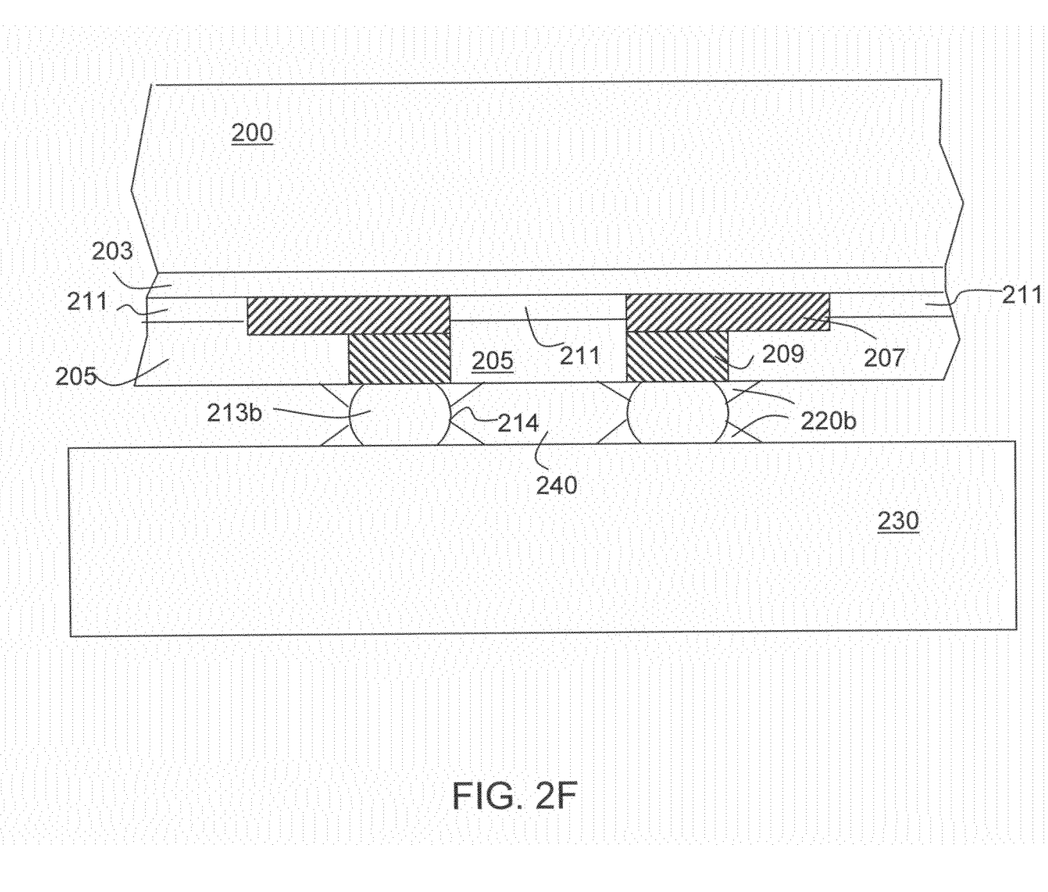
FIGS. 2F-2H are schematic cross-sectional views of exemplary package structures.
Figure 2G:
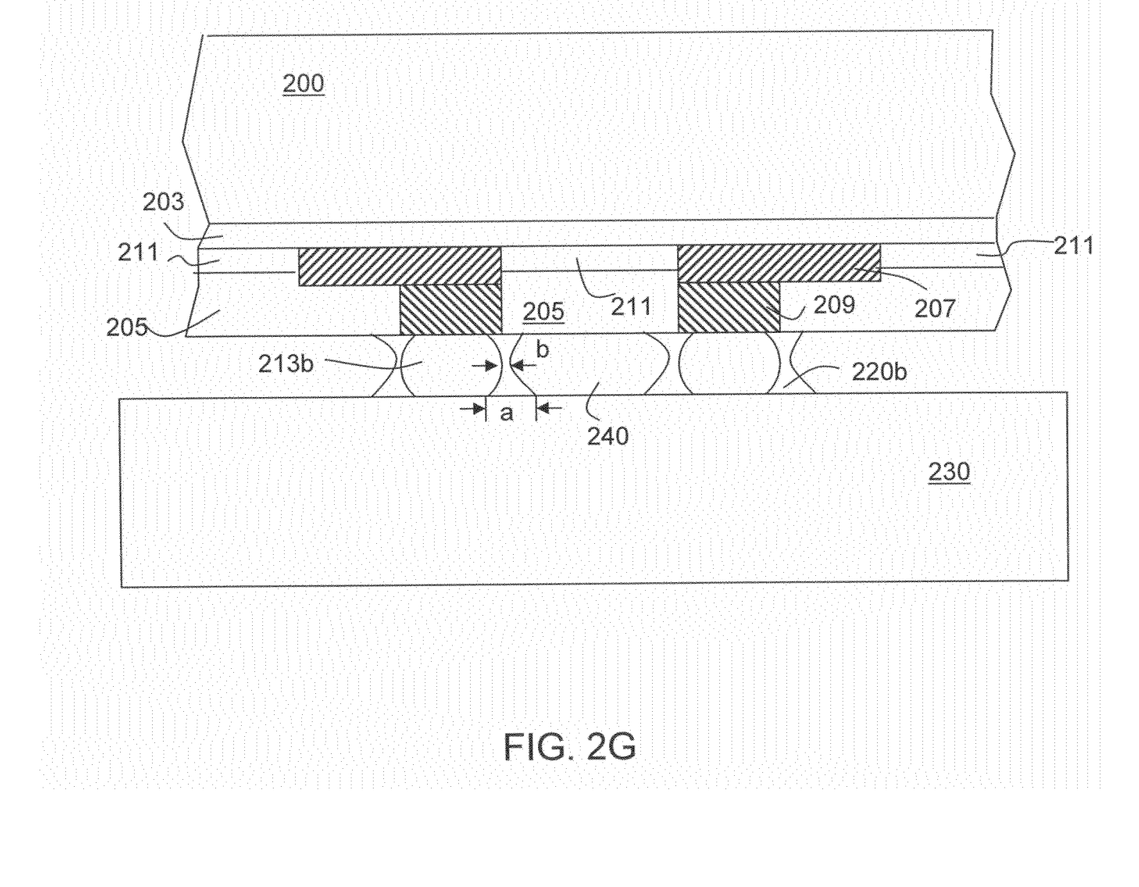
Figure 2H:
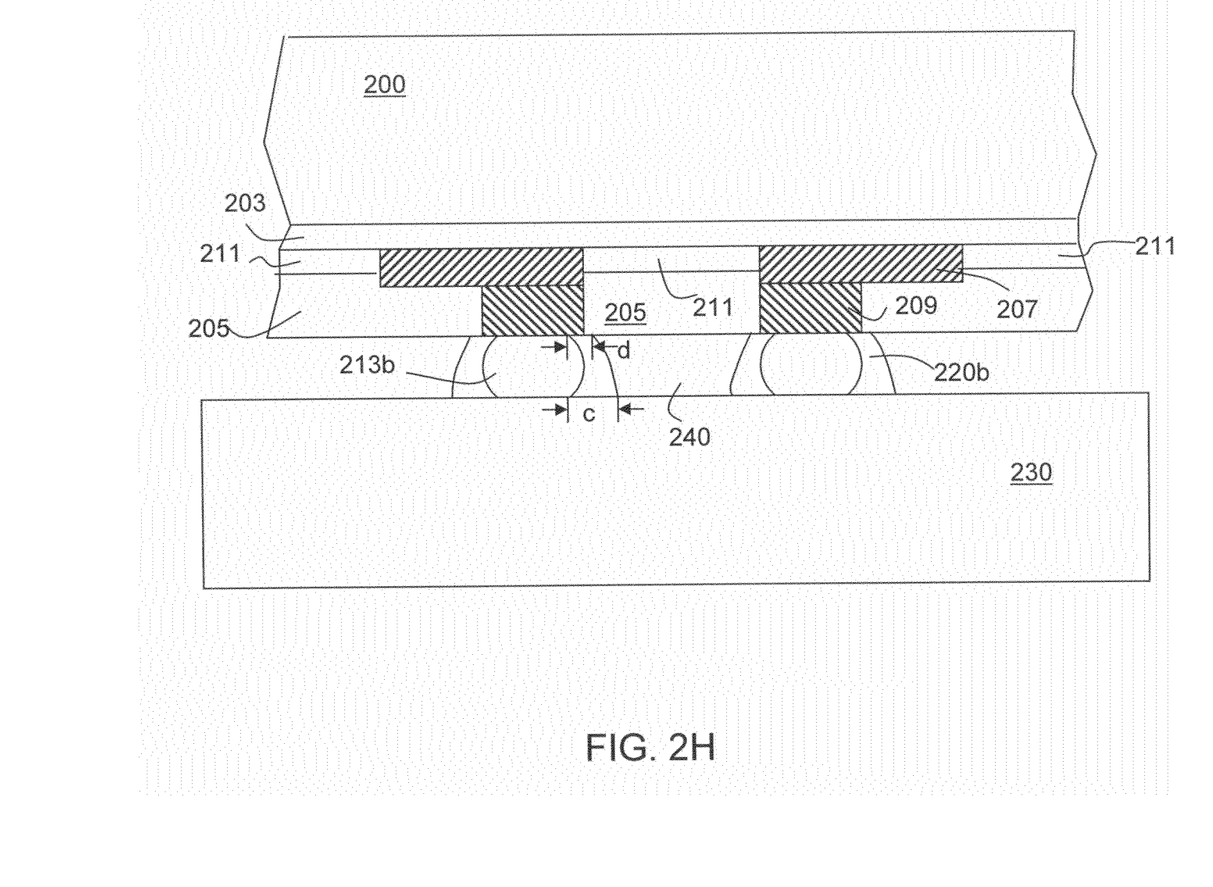

FIGS. 2F-2H are schematic cross-sectional views of exemplary package structures.

Referring to FIG. 2F, the encapsulation material layers 220b may lie on the sidewalls 214 of the solder structures 213b near to the surface of the passivation layer 205 and the surface of the substrate 230 without substantially lying on the middle region of the solder structures 213b.

Referring to FIG. 2G, the encapsulation material layers 220b may lie on the sidewalls 214 of the solder structures 213b such that the dimension "a" of the material layers 220b lying in the region adjacent to the surfaces of the substrate 230 and/or the passication layer 205 is larger than the dimension "b" of the material layers 220b lying in the middle region of the solder structures 213b, forming an hourglass shape.

Referring to FIG. 2H, the encapsulation material layers 220b may lie on the sidewalls 214 of the solder structures 213b such that the dimension "c" of the material layers 220b lying in the region adjacent to the surface of the substrate 230 is larger than the dimension "d" of the material layers 220b lying in the region adjacent to the surface of the passivation layer 205.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A semiconductor method, comprising:
    forming a plurality of solder balls or solder bumps over a first substrate;
    forming a planar layer of encapsulation material over the first substrate, partially covering the solder balls or solder bumps, the planar layer extending an entire distance between a first one of the solder balls or solder bumps and a second one of the solder balls or solder bumps;
    flowing the planar layer of encapsulation material along at least one side wall of at least the first and second ones of the solder balls or solder bumps, to form a first encapsulation material portion around the first solder ball or solder bump and a second encapsulation material portion around the second solder ball or solder bump, wherein the first and second solder balls or solder bumps are near to each other and a gap is formed between the first and second encapsulation material portions.

2. A semiconductor method, comprising:
    forming a plurality of solder structures over a first substrate;
    forming a planar layer of encapsulation material over the first substrate, partially covering the solder structures;
    flipping the first substrate after forming the planar layer of encapsulation material;
    thermally treating the planar layer of encapsulation material over a second substrate so as to melt the encapsulation material to flow along at least one side wall of at least first and second ones of the solder structures, to form a first encapsulation material portion around the first solder structure and a second encapsulation material portion around the second solder structure, wherein the first and second solder structures are near to each other and a gap is formed between the first and second encapsulation material portions; and reflowing the solder structures over the second substrate for electrical connection.

3. The semiconductor method of claim 2, wherein the step of forming a planar layer of encapsulation material includes forming the planar layer of material with a uniform thickness.

4. The semiconductor method of claim 2, wherein the step of forming a planar layer of encapsulation material comprises a spin-coating process.

5. The semiconductor method of claim 2, wherein the thermally heating step has a heating temperature between about 100° C. and about 160° C.

6. The semiconductor method of claim 2, wherein the reflowing step has a reflowing temperature between about 160° C. and about 240° C.

7. The semiconductor method of claim 2, wherein the thermally heating step melts the encapsulation material so as to form an encapsulation material layer on the sidewall of the first and second solder structures having a first thickness adjacent to the first substrate larger than a second thickness adjacent to the second substrate.

8. The semiconductor method of claim 2, wherein the thermally heating step melts the encapsulation material so as to form an encapsulation material layer on the sidewall of the first and second solder structures having a first thickness adjacent to the first substrate is larger than a second thickness adjacent to a middle region of the first and second solder structures.

9. The semiconductor method of claim 2, wherein the thermally heating step melts the encapsulation material so as to form an encapsulation material layer substantially conformal on the sidewall of the first and second solder structures.

10. The semiconductor method of claim 2, wherein the encapsulation material is formed between about ⅓ of a height of the first and second solder structures and about 9/10 of the height of the at least one of the solder structures.

11. The semiconductor method of claim 2, wherein the encapsulation material comprises a mixture of resin powder and flux.

12. The semiconductor method of claim 11, wherein the flux comprises de-oxidation material.

13. The semiconductor method of claim 11, wherein the flux comprises at least one of epoxy and polyimide.

14. The semiconductor method of claim 2, wherein the encapsulation material has a coefficient of thermal expansion (CTE) from about a CTE of the first substrate to about a CTE of the second substrate.

15. The semiconductor method of claim 2, wherein at least one of the first encapsulation material and the second encapsulation material has a melting temperature between about 100° C. and about 240° C.

16. The semiconductor method of claim 2, wherein the encapsulation material flows along an entire height of the first and second solder structures, from a top thereof to a bottom thereof.

17. The semiconductor method of claim 2, wherein the first and second encapsulation material portions on the sidewalls of the first and second solder structures have a first thickness adjacent to the first substrate larger than a second thickness adjacent to a middle region of the first and second solder structures, and a third thickness adjacent to the second substrate is larger than the second thickness adjacent to the middle region s.

18. The semiconductor method of claim 2, wherein the first encapsulation material portion has substantially the same thickness over an entire height of at least one sidewall of the first one of the solder structures.

19. A semiconductor method, comprising:

forming a plurality of solder structures over a first substrate;

forming a planar layer of encapsulation material over the first substrate, partially covering the solder structures, the planar layer extending an entire distance between a first one of the solder structures and a second one of the solder structures at a time the encapsulation material forming the planar layer is deposited;

flowing the planar layer of encapsulation material along at least one side wall of at least the first and second ones of the solder structures after the encapsulation material forming the planar layer is deposited, to form a first encapsulation material portion around the first solder structure and a second encapsulation material portion around the second solder structure, so the planar layer no longer extends the entire distance after the flowing, wherein the first and second solder structures are near to each other and, and a gap is formed between the first and second encapsulation material portions.

20. The method of claim 19, wherein the step of forming the planar layer is performed after the step of forming the plurality of solder structures.

* * * * *